(12) United States Patent
Zuberi

(10) Patent No.: US 8,039,050 B2
(45) Date of Patent: *Oct. 18, 2011

(54) METHOD AND APPARATUS FOR STRENGTHENING A POROUS SUBSTRATE

(75) Inventor: Bilal Zuberi, Cambridge, MA (US)

(73) Assignee: GEO2 Technologies, Inc., Woburn, MA (US)

( * ) Notice: Subject to any disclaimer, the term of this patent is extended or adjusted under 35 U.S.C. 154(b) by 567 days.

This patent is subject to a terminal disclaimer.

(21) Appl. No.: 11/614,305

(22) Filed: Dec. 21, 2006

(65) Prior Publication Data

US 2007/0141255 A1    Jun. 21, 2007

Related U.S. Application Data

(60) Provisional application No. 60/753,094, filed on Dec. 21, 2005.

(51) Int. Cl.
*C23C 16/00* (2006.01)
*B32B 37/00* (2006.01)

(52) U.S. Cl. .................................. 427/248.1; 264/171.1

(58) Field of Classification Search .................... 427/900
See application file for complete search history.

(56) References Cited

U.S. PATENT DOCUMENTS

| | | | | |
|---|---|---|---|---|
| 2,752,001 | A | * | 6/1956 | Muller |
| 3,819,334 | A | * | 6/1974 | Yoshida et al. |
| 3,899,555 | A | * | 8/1975 | Takao et al. |
| 3,912,658 | A | * | 10/1975 | Kaneko et al. |
| 3,961,907 | A | * | 6/1976 | Close et al. |
| 4,047,965 | A | * | 9/1977 | Karst et al. |
| 4,053,011 | A | * | 10/1977 | Riewald et al. |
| 4,071,594 | A | * | 1/1978 | Pearson et al. |
| 4,169,911 | A | * | 10/1979 | Yoshida et al. |
| 4,329,162 | A | * | 5/1982 | Pitcher, Jr. |
| 4,402,893 | A | * | 9/1983 | Kitamura et al. |
| 4,409,284 | A | * | 10/1983 | Sugino et al. |
| 4,416,676 | A | * | 11/1983 | Montierth |
| 4,417,908 | A | * | 11/1983 | Pitcher, Jr. |
| 4,419,108 | A | * | 12/1983 | Frost et al. |

(Continued)

FOREIGN PATENT DOCUMENTS

WO    WO/03067041    *    8/2003

(Continued)

OTHER PUBLICATIONS

"Ceramic Catalyst Substrates", *DieselNet Technology Guide* www.DieselNet.com Apr. 1997.

(Continued)

*Primary Examiner* — Timothy Meeks
*Assistant Examiner* — Joseph Miller, Jr.

(57) ABSTRACT

A process is provided for strengthening a porous substrate. The process includes providing a substrate having intersecting fibers, where the intersecting fibers cooperate in the final substrate product to form an open pore network. Pathways are opened into the fibrous substrate structure, which enable a flow of gas into the or through the substrate. The substrate is positioned in a CVD (chemical vapor deposition) station, and one or more layers of a strengthening agent is deposited. The deposited layer or layers form a strong coating around fibers and fiber intersections to provide additional strength to the substrate. The strengthened substrate may then be used in wide variety of applications and fields. Advantageously, the disclosed fiber strengthening process produces a substrate having high porosity and higher strength characteristics as compared to a non-strengthened substrate.

19 Claims, 10 Drawing Sheets

U.S. PATENT DOCUMENTS

| | | | |
|---|---|---|---|
| 4,420,316 A * | 12/1983 | Frost et al. | |
| 4,448,833 A * | 5/1984 | Yamaguchi et al. | |
| 4,608,361 A * | 8/1986 | Kanamori et al. | |
| 4,652,286 A * | 3/1987 | Kusuda et al. | |
| 4,761,323 A * | 8/1988 | Muhlratzer et al. | |
| 4,810,458 A * | 3/1989 | Oshima | |
| 4,824,711 A * | 4/1989 | Cagliostro et al. | 428/116 |
| 4,828,785 A * | 5/1989 | Newkirk et al. | |
| 4,833,115 A * | 5/1989 | Koschlig et al. | |
| 4,868,142 A * | 9/1989 | Waisala | |
| 4,966,873 A * | 10/1990 | Iida et al. | |
| 4,968,467 A * | 11/1990 | Zievers | |
| 5,053,092 A | 10/1991 | Lachman | |
| 5,070,588 A | 12/1991 | Miwa et al. | |
| 5,075,160 A | 12/1991 | Stinton et al. | |
| 5,078,818 A | 1/1992 | Han et al. | |
| 5,098,455 A | 3/1992 | Doty et al. | |
| 5,123,243 A | 6/1992 | Baddour | |
| 5,126,431 A | 6/1992 | Nesheiwat | |
| 5,153,057 A | 10/1992 | Corbett | |
| 5,194,407 A | 3/1993 | Waisala et al. | |
| 5,194,414 A | 3/1993 | Kuma | |
| 5,196,120 A | 3/1993 | White | |
| 5,207,807 A | 5/1993 | Manfre et al. | |
| 5,221,484 A | 6/1993 | Goldsmith et al. | |
| 5,242,863 A * | 9/1993 | Xiang-Zheng et al. | 438/53 |
| 5,249,948 A | 10/1993 | Koslow | |
| 5,251,564 A | 10/1993 | Rim et al. | |
| 5,260,035 A | 11/1993 | Lachman et al. | |
| 5,290,522 A | 3/1994 | Rogers et al. | |
| 5,298,046 A | 3/1994 | Piesert | |
| 5,316,710 A | 5/1994 | Tasaki et al. | |
| 5,322,537 A | 6/1994 | Nakamura et al. | |
| 5,335,712 A | 8/1994 | Corbett et al. | |
| 5,338,253 A | 8/1994 | Damsohn et al. | |
| 5,348,987 A | 9/1994 | Kato et al. | |
| 5,376,341 A | 12/1994 | Gulati | |
| 5,488,017 A | 1/1996 | Szweda et al. | |
| 5,492,580 A | 2/1996 | Frank | |
| 5,518,678 A | 5/1996 | Miyamoto et al. | |
| 5,518,833 A | 5/1996 | Repplinger et al. | |
| 5,545,297 A | 8/1996 | Andersen et al. | |
| 5,549,859 A | 8/1996 | Andersen et al. | |
| 5,611,831 A | 3/1997 | Matsuoka et al. | |
| 5,622,041 A | 4/1997 | Feeley et al. | |
| 5,623,013 A | 4/1997 | Tanaka et al. | |
| 5,629,067 A | 5/1997 | Kotani et al. | |
| 5,662,731 A | 9/1997 | Andersen et al. | |
| 5,681,373 A | 10/1997 | Taylor et al. | |
| 5,707,584 A | 1/1998 | Terpstra et al. | |
| 5,714,226 A | 2/1998 | Disselbeck | |
| 5,750,026 A | 5/1998 | Gadkaree et al. | |
| 5,759,219 A | 6/1998 | Rink et al. | |
| 5,820,833 A | 10/1998 | Kawamura | |
| 5,851,326 A | 12/1998 | Custer et al. | |
| 5,853,439 A | 12/1998 | Gieseke et al. | |
| 5,900,207 A | 5/1999 | Danforth et al. | |
| 5,914,187 A | 6/1999 | Naruse et al. | |
| 5,948,257 A | 9/1999 | Custer et al. | |
| 5,998,328 A | 12/1999 | Dawes et al. | |
| 6,040,266 A | 3/2000 | Fay et al. | |
| 6,057,030 A | 5/2000 | Mano | |
| 6,117,518 A | 9/2000 | Cawse et al. | |
| 6,155,432 A | 12/2000 | Wilson et al. | |
| 6,179,460 B1 | 1/2001 | Burkhardt et al. | |
| 6,194,066 B1 | 2/2001 | Hoffman | |
| 6,228,293 B1 | 5/2001 | Kriegsmann et al. | |
| 6,238,618 B1 | 5/2001 | Brundage et al. | |
| 6,261,510 B1 | 7/2001 | Terpstra et al. | |
| 6,321,915 B1 | 11/2001 | Wilson et al. | |
| 6,365,092 B1 | 4/2002 | Backa et al. | |
| 6,375,450 B1 | 4/2002 | Golomb et al. | |
| 6,379,446 B1 | 4/2002 | Andersen et al. | |
| 6,423,537 B1 | 7/2002 | Soria et al. | |
| 6,444,006 B1 | 9/2002 | Haberkamp et al. | |
| 6,471,394 B2 | 10/2002 | Kesig | |
| 6,506,336 B1 | 1/2003 | Beall et al. | |
| 6,547,967 B1 | 4/2003 | Adler et al. | |
| 6,582,490 B2 | 6/2003 | Miller et al. | |
| 6,613,384 B1 | 9/2003 | Waller | |
| 6,651,773 B1 | 11/2003 | Marocco | |
| 6,669,751 B1 | 12/2003 | Ohno et al. | |
| 6,716,376 B1 | 4/2004 | Haug et al. | |
| 6,860,917 B2 | 3/2005 | Henrichsen et al. | |
| 6,881,361 B1 | 4/2005 | Schulze et al. | |
| 6,899,777 B2 | 5/2005 | Vaidyanathan et al. | |
| 6,935,461 B2 | 8/2005 | Marocco | |
| 6,946,013 B2 | 9/2005 | Alward et al. | |
| 6,991,672 B2 | 1/2006 | Marrecau et al. | |
| 6,991,673 B2 | 1/2006 | Wastijn et al. | |
| 7,041,359 B2 | 5/2006 | Hijikata | |
| 7,052,532 B1 | 5/2006 | Liu et al. | |
| 7,052,760 B2 | 5/2006 | Hijikata | |
| 7,078,004 B2 | 7/2006 | Voss et al. | |
| 7,078,086 B2 | 7/2006 | Hijikata | |
| 7,083,842 B2 | 8/2006 | Masukawa et al. | |
| 7,090,715 B2 | 8/2006 | Chung et al. | |
| 7,112,050 B2 | 9/2006 | Bernas et al. | |
| 7,138,002 B2 | 11/2006 | Hamanaka et al. | |
| 7,138,003 B2 | 11/2006 | Ichikawa et al. | |
| 7,179,516 B2 | 2/2007 | Ichikawa | |
| 7,404,840 B2 | 7/2008 | Wood et al. | |
| 7,486,962 B2 | 2/2009 | Zuberi et al. | |
| 7,510,755 B2 | 3/2009 | Masukawa et al. | |
| 7,578,865 B2 | 8/2009 | Zuberi et al. | |
| 2001/0037972 A1 * | 11/2001 | Quick et al. | |
| 2002/0014723 A1 * | 2/2002 | Wallin et al. | |
| 2002/0090873 A1 * | 7/2002 | Moody | 442/268 |
| 2002/0162310 A1 * | 11/2002 | Miller et al. | 55/523 |
| 2003/0101701 A1 | 6/2003 | Henrichsen et al. | |
| 2003/0127393 A1 | 7/2003 | Tepper et al. | |
| 2003/0131759 A1 | 7/2003 | Francis et al. | |
| 2003/0157358 A1 * | 8/2003 | Arthurs et al. | |
| 2003/0178357 A1 | 9/2003 | Wolff et al. | |
| 2004/0028813 A1 * | 2/2004 | Thebault et al. | 427/249.15 |
| 2004/0029707 A1 | 2/2004 | Beall et al. | |
| 2004/0091709 A1 | 5/2004 | Ohmura et al. | |
| 2004/0103627 A1 | 6/2004 | Dullien et al. | |
| 2004/0139734 A1 | 7/2004 | Schmeichel et al. | |
| 2004/0147192 A1 * | 7/2004 | Connors et al. | 442/175 |
| 2004/0148916 A1 * | 8/2004 | Merkel | |
| 2004/0194505 A1 | 10/2004 | Wang et al. | |
| 2004/0231307 A1 | 11/2004 | Wood et al. | |
| 2004/0250683 A1 * | 12/2004 | Soane et al. | |
| 2005/0020432 A1 * | 1/2005 | Roy et al. | |
| 2005/0040003 A1 * | 2/2005 | Kienzle et al. | |
| 2005/0042151 A1 * | 2/2005 | Alward et al. | |
| 2005/0049362 A1 * | 3/2005 | Buckley et al. | |
| 2005/0069469 A1 * | 3/2005 | Fu et al. | |
| 2005/0074374 A1 * | 4/2005 | Ogura | |
| 2005/0102987 A1 * | 5/2005 | Kudo | |
| 2005/0109023 A1 * | 5/2005 | Kudo et al. | |
| 2005/0126140 A1 * | 6/2005 | Ito et al. | |
| 2005/0181193 A1 * | 8/2005 | Lenke et al. | |
| 2005/0212186 A1 * | 9/2005 | Noguchi et al. | |
| 2005/0217228 A1 * | 10/2005 | Beall et al. | |
| 2005/0230029 A1 * | 10/2005 | Vaidyanathan et al. | |
| 2005/0266991 A1 * | 12/2005 | Ohno et al. | |
| 2005/0271920 A1 * | 12/2005 | Eshraghi et al. | |
| 2006/0003143 A1 * | 1/2006 | Uchida et al. | 428/116 |
| 2006/0075273 A1 * | 4/2006 | Ohno et al. | |
| 2006/0154057 A1 * | 7/2006 | Nonninger | |
| 2006/0272306 A1 * | 12/2006 | Kirk et al. | |
| 2006/0292393 A1 * | 12/2006 | Kunieda | |
| 2007/0032370 A1 * | 2/2007 | Weisensel et al. | |
| 2007/0044443 A1 * | 3/2007 | Nixdorf et al. | |
| 2007/0108647 A1 * | 5/2007 | Zuberi et al. | |
| 2007/0111878 A1 * | 5/2007 | Zuberi et al. | |
| 2007/0141255 A1 * | 6/2007 | Zuberi | |
| 2007/0261557 A1 * | 11/2007 | Gadkaree et al. | |
| 2009/0041975 A1 * | 2/2009 | Kodama et al. | |

FOREIGN PATENT DOCUMENTS

| | | | |
|---|---|---|---|
| WO | WO2004/337745 | * | 5/2004 |

OTHER PUBLICATIONS

"Ceramic Fibers and Cartridges", *DieselNet Technology Guide* www.DieselNet.com Jan. 2003.

"Diesel Filter Materials", *DieselNet Technology Guide* www.DieselNet.com Jan. 2003.

"Fiber-reinforced SiC", *Jpn. Technol. Highlights* vol. 6, No. 4, ISSN: 1060-8117 Feb. 22, 1995, 15.

"Porosity reduces CMC properties", *Adv. Compos. Bull.* ISSN: 0951-953X Feb. 1995, 2-3.

"Rapid preforming developed for metal matrix composites", *High-Performance Composites*, vol. 9, No. 1 ISSN: 1081-9223 Jan.-Feb. 2001, 60.

"Wall-Flow Monoliths", *DieselNet Technology Guide* www.DieselNet.com Sep. 2005.

Blackburn, Stuart et al., "Mullite-Alumina Composites by Extrusion", *J. Am. Ceram. Soc.* 75[4] 1992, 953-957.

Cooke, Theodore F., "Inorganic Fibers—A Literature Review", *J. Am. Ceram. Soc.*, 74 (12) 1991, 2959-2978.

Gulati, Suresh T., "Physical Durability of Thin Wall Ceramic Substrates", *SAE Technical Paper Series* 982635 Oct. 1998.

Li, Cheng G. et al., "Properties and Performance of Diesel Particulate Filters of an Advanced Ceramic Material", *SAE Technical Paper Series* 2004-01-0955 Mar. 2004.

Miller, Robert K. et al., "Design, Development and Performance of a Composite Diesel Particulate Filter", *SAE Technical Paper Series* 2002-01-0323 Mar. 2002.

\* cited by examiner

Table 2 - - Binder Selection

ORGANIC BINDERS

Thermo Plastic Resins
polyethylene
polypropylene
polybutene
polystyrene
poly vinyl acetate
polyester
Isotactic polypropylen
atactic polypropylene
polysulphone
polyacetal polymers
polymethyl methacrylate
fumaron-indane copolymer
ethylene vinyl acetate copolymer
styrene-butadiene copolymer
acryl rubber
polyvinyl butyral
inomer resin Thermosetting Binders
Epoxy resin
nylon
phenol formaldehide
phenol furfural Waxes
paraffin wax
wax emulsions
microcrystalline wax Others
Celluloses
dextrines
chlorinated hydrocarbons
refined alginates
starches
gelatins
lignins
rubbers
acrylics
bitumens
casein
gums
albumins
proteins
glycols

INORGANIC BINDERS
soluble silicates
soluble aluminates
soluble phosphates
ball clay
kaolin
bentonite
colloidal silica
colloidal alumina
borophosphates

WATER SOLUABLE BINDERS
Hydroxypropyl methyl cellulose
hydroxyethyl cellulose
methyl cellulose
sodium carboxymethyl cellulose
polyvinyl alcohol
polyvinyl pyrrolidone
polyethylene oxide
polyacrylamides
polyethyterimine
agar
agarose
molasses
dextrines
starch
lignosulfonates
lignin liquor
sodium alginate
gum arabic
xanthan gum
gum tragacanth
gum karaya
locust bean gum
irish moss
scleroglucan
acrylics
cationic galactomanan

PLASTICIZERS
Stearic acid
polyethylene glycol
polypropylene glycol
propylene glycol
ethylene glycol
diethylene glycol
triethylene glycol
tetraethylene glycol
dimethyl phthalate
dibutyl phthalate
diethyl phthalate
dioctyl phthalate
diallyl phthalate
glycerol
oleic acid
butyl stearate
microcrystalline wax
paraffin wax
japan wax
carnauba wax
bees wax
ester wax
vegetable oil
fish oil
silicon oil
hydrogenated peanut oil
tritolyl phosphate
clycerol monostearate
organo silane
water

FIG. 7
(CONTINUED)

TABLE 3 -- PORE FORMER SELECTION

315

Carbon black
activated carbon
graphite flakes
synthetic graphite
wood flour
modified starch
starch
celluloses
coconut shell flour
husks
latex spheres
bird seeds
saw dust
<u>pyrolyzable polymers</u>
    poly (alkyl methacrylate)
        polymethyl methacrylate
        polyethyl methacrylate
        poly n-butyl methacrylate
    polyethers
        poly tetrahydrofuran
        poly (1,3-dioxolane)
    poly (alkalene oxides)
        polyethylene oxide
        polypropylene oxide <u>pyrolyzable polymers (cont)</u>
methacrylate copolymers
polyisobutylene
polytrimethylene carbonate
poly ethylene oxalate
poly beta-propiolactone
poly delta-valerolactone
polyethylene carbonate
polypropylene carbonate
vinyl toluene/alpha-methyl styrene copolymer
styrene/alpha-methyl styrene copolymers
olefin-sulfur dioxide copolymers

325

TABLE 4 -- FLUID SELECTION

Water
Melted Binder (see Table 2)
Organic solvents

FIG. 7
(CONTINUED)

METHOD AND APPARATUS FOR STRENGTHENING A POROUS SUBSTRATE

CROSS-REFERENCE TO RELATED APPLICATIONS

This application claims the benefit of U.S. Provisional Patent Application Ser. No. 60/753,094, filed on Dec. 21, 2005, the entirety of which is incorporated by reference.

BACKGROUND OF THE INVENTION

The present invention relates generally to processes for strengthening a porous substrate, and in one particular implementation to a process for CVD deposition of a strengthening agent into a porous ceramic substrate.

Many applications require strong materials for facilitating and supporting various processes. For example, substrates are used in filtering applications to filter particulate matter, separate different substances, or remove bacteria or germs from air. These substrates may be constructed to operate in air, exhaust gases or liquids, and may be manufactured to endure substantial environmental or chemical stresses. In another example, catalytic materials are deposited on the substrate for facilitating chemical reactions. For example, a precious metal may be deposited on an appropriate substrate, and the substrate may then act to catalytically convert dangerous exhaust gases into less noxious gases. Typically, these rigid substrates operate more effectively with a higher porosity.

Porosity is generally defined as the property of a solid material defining the percentage of the total volume of that material which is occupied by open space. For example, a substrate with 50% porosity has half the volume of the substrate occupied by open spaces. In this way, a substrate with a higher porosity has less mass per volume than a substrate with a lower porosity. Some applications benefit from a lower mass substrate. For example, if a substrate is used to support a catalytic process, and the catalytic process operates at an elevated temperature, a substrate with a lower thermal mass will more quickly heat to its operational temperature. In this way, the time for the catalyst to be heated to its operational temperature, i.e., light off time, is reduced by using a more porous and less thermally massive substrate.

Permeability is also an important characteristic for substrates, particularly filtering and catalytic substrates. Permeability is related to porosity, in that permeability is a measure of how easily a fluid, such as a liquid or gas, which may flow through the substrate. Most applications benefit from a highly permeable substrate. For example, an internal combustion engine operates more efficiently when the after-treatment filter provides lower back pressure to the engine. Low back pressure is created by using a more highly permeable substrate. Since permeability is more difficult to measure than porosity, porosity is often used as a substitute guide to the permeability of a substrate. However, this is not a particularly accurate characterization, as a substrate may be quite porous but still have limited permeability if the pores are not generally open and interconnected. For example, a Styrofoam drinking cup is formed of a highly porous foam material, but is not permeable to the flow of liquid. Therefore, in considering the importance of porosity and permeability, the pore structure of the substrate must also be examined. In the example of the Styrofoam cup, the Styrofoam material has a closed pore network. This means that the foam contains many non connected and/or closed-ended pores. In this way, there are many voids and open spaces within the foam, but since the pore are not connected, the fluid or gas cannot flow from one side of the foam to the other. As more of the pores begin to interconnect, then fluid paths begin to form from one side to the other. The more pores and passageways formed through the material, the higher the permeability becomes for the substance. In the case where every pore is connected to another pore, and all pores allow for fluid flow, the substrate would be defined as having a completely open pore network. However, such open pore network substrates are not known in the filtering or catalytic industries. Instead, even the most porous available extruded substrates are a hybrid of opened pore and closed pore porosity.

Accordingly, it is highly desirable for many applications that substrates be formed with high porosity, and with an internal pore structure that enables a similarly high permeability. Also, the substrates have to be formed with a sufficiently rigid structure to support the structural and environmental requirements for particular applications. However, because a higher porosity substrate has less structural material, it may need additional strength to operate in some environments. For example, a filter or catalytic converter that is to be attached to internal combustion engine must be able to withstand the likely environmental shock, thermal requirements, and manufacturing and use stresses.

Extrusion has proven to be an efficient and cost-effective process to manufacture rigid substrates of constant cross section. More particularly, extrusion of ceramic powder material is the most widely used process for making filter and catalytic substrates for internal combustion engines. Over the years, the process of extruding powdered ceramics has advanced such that substrates may now be extruded having porosities approaching 60%. These extruded porous substrates have had good strength characteristics, may be flexibly manufactured, may be manufactured at scale, maintain high quality levels, and are very cost-effective. However, extrusion of powdered ceramic material has reached a practical upper limit of porosity, and further increases in porosity appear to result in an unacceptably low strength. For example, as porosity is increased beyond 60%, the extruded ceramic powder substrate has not proven strong enough to operate in the harsh environment of a diesel particulate filter. In another limitation of the known extrusion processes, it has been desired to increase the surface area in a substrate to allow for more efficient catalytic conversion. In order to increase surface area, extruded ceramic powder substrates have tried to increase cell density, but the increase in cell density has resulted in an unacceptable back pressure to the engine. Thus, the extruded ceramic powder substrate does not have sufficient strength at very high porosities, and also produces unacceptable back pressure when there is a need for increased surface area. Accordingly, the extrusion of ceramic powder appears to have reached its practical utility limits.

In an effort to obtain higher porosities, filter suppliers have attempted to move to pleated ceramic papers. Using such pleated ceramic papers, porosities of about 80% are possible with very low back pressure. With such low back pressure, these filters have been used in applications, such as mining, where extremely low back pressure is a necessity. However, the use of the pleated ceramic paper filters has been sporadic, and has not been widely adopted. For example, pleated ceramic papers have not effectively been used in harsh environments. Manufacturing the pleated ceramic papers requires the use of a paper making process that creates ceramic paper structures that are relatively weak, and do not appear to be cost-effective as compared to extruded filters. Further, the formation of pleated ceramic papers allows very little flexibility in cell shape and density. For example, it is difficult to create a paper pleated filter with large inlet channels and smaller outlet channels, which may be desirable in some filtering applications. Accordingly, the use of pleated ceramic papers has not satisfied the requirement for higher porosity filter and catalytic substrates.

In another example of an effort to increase porosity and to avoid the disadvantages of pleated paper, some have built substrates by forming a mass with ceramic precursors and carefully processing the mass to grow mono-crystalline whiskers in a porous pattern. However, growing these crystals in-situ requires careful and accurate control of the curing process, making the process difficult to scale, relatively expensive, and prone to defects. Further, this difficult process only gives a few more percentage points in porosity. Finally, the process only grows a mullite type crystalline whisker, which limits the applicability of the substrate. For example, mullite is known to have a large coefficient of thermal expansion, which makes crystalline mullite whiskers undesirable in many applications needing a wide operational temperature band.

Accordingly, the industry has a need for a substrate that has high porosity and an associated high permeability, and can be strengthened to operate in a wide variety of applications. Preferably, the substrate would be formed as a highly desirable open pore network, would be cost-effective to manufacture, and could be manufactured with flexible physical, chemical, and reaction properties.

BRIEF SUMMARY OF THE INVENTION

Briefly, the present invention provides a process for strengthening a porous substrate. The process includes providing a substrate having intersecting fibers, where the intersecting fibers cooperate in the final substrate product to form an open pore network. Pathways are opened into the fibrous substrate structure, which enable a flow of gas into the or through the substrate. The substrate is positioned in a CVD (chemical vapor deposition) station, and one or more layers of a strengthening agent is deposited. The deposited layer or layers form a strong coating around fibers and fiber intersections to provide additional strength to the substrate. The strengthened substrate may then be used in wide variety of applications and fields. Advantageously, the disclosed fiber strengthening process produces a substrate having high porosity and higher strength characteristics as compared to a non-strengthened substrate.

These and other features of the present invention will become apparent from a reading of the following description, and may be realized by means of the instrumentalities and combinations particularly pointed out in the appended claims.

BRIEF DESCRIPTION OF THE SEVERAL VIEWS OF THE DRAWING

The drawings constitute a part of this specification and include exemplary embodiments of the invention, which may be embodied in various forms. It is to be understood that in some instances various aspects of the invention may be shown exaggerated or enlarged to facilitate an understanding of the invention.

DETAILED DESCRIPTION OF THE INVENTION

Detailed descriptions of examples of the invention are provided herein. It is to be understood, however, that the present invention may be exemplified in various forms. Therefore, the specific details disclosed herein are not to be interpreted as limiting, but rather as a representative basis for teaching one skilled in the art how to employ the present invention in virtually any detailed system, structure, or manner.

Figure 1:
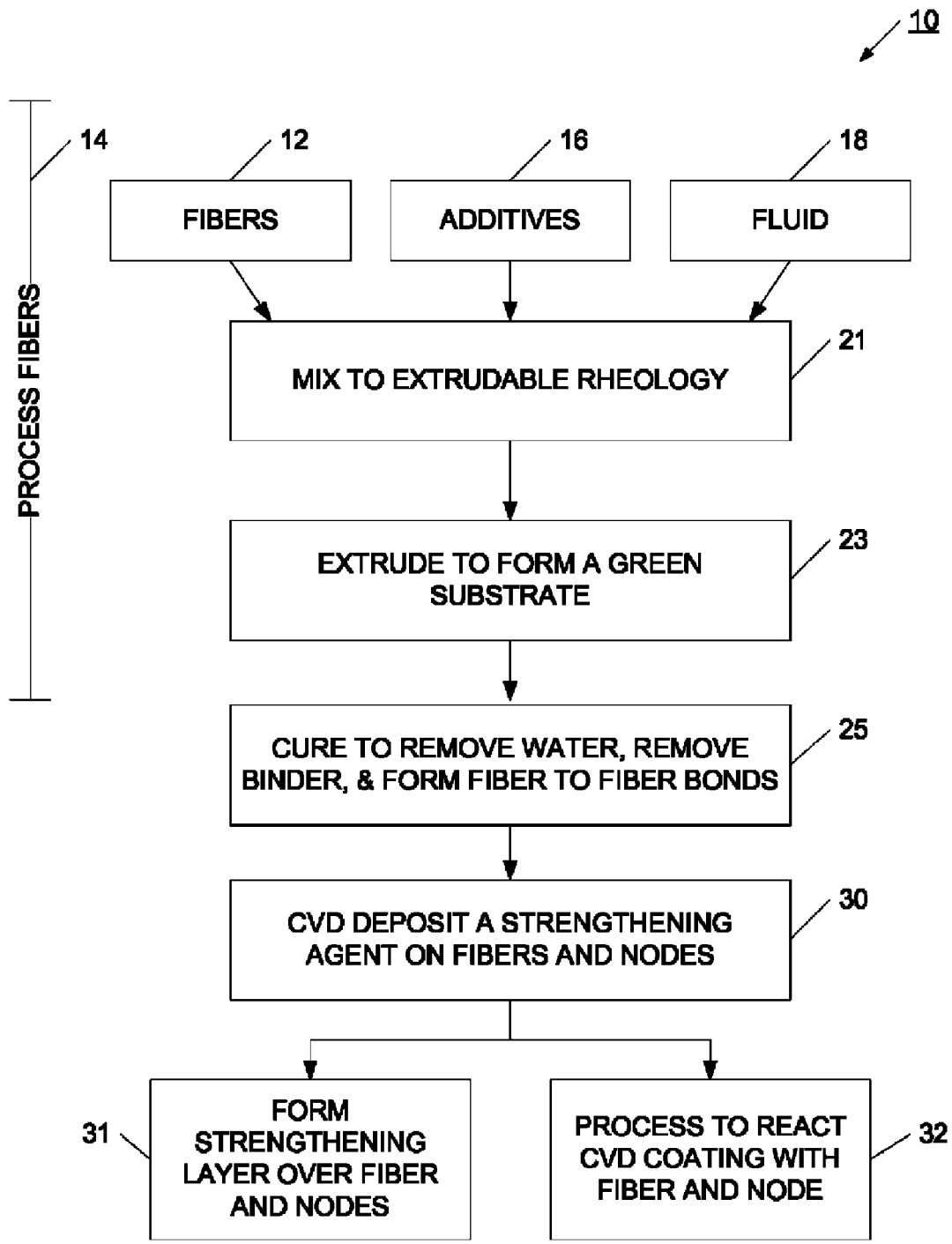
FIG. 1 is a flowchart of a CVD process for strengthening a porous substrate in accordance with the present invention.

Referring now to FIG. 1, a process 10 for strengthening a porous substrate is illustrated. In the example illustrated in FIG. 1, the substrate is manufactured using an extrusion process, and then the extruded substrate is strengthened using a CVD (chemical vapor deposition process). Although process 10 uses an extrusion process to provide the substrate, it will be appreciated that other manufacturing processes may be used. For example, the substrate may be provided using a casting, broaching, or other process. As illustrated, process 10 uses an extrusion process to extrude a green substrate that can be cured and strengthened into the final highly porous substrate product. Process 10 advantageously produces a substrate with high porosity, with a substantially open pore network enabling an associated high permeability, and that may be additionally strengthened by the CVD process to have sufficient strength for a wide variety of applications. The process 10 is easily scalable to mass production, and allows for flexible chemistries and constructions to support multitudes of applications.

Process 10 enables a highly flexible extrusion process, so is able to accommodate a wide range of specific applications. In using process 10, the substrate designer first establishes the requirements for the substrate. These requirements may include, for example, size, fluid permeability, desired porosity, pore size, mechanical strength and shock characteristics, thermal stability, and chemical reactivity limitations. According to these and other requirements, the designer selects materials to use in forming an extrudable mixture. Importantly, process 10 uses fibers 12 in the formation of an extruded substrate. These fibers may be, for example, ceramic fibers, organic fibers, inorganic fibers, polymeric fibers, amorphous fibers, crystalline fibers, vitreous fibers, ceramic oxide fibers, ceramic carbide fibers, ceramic non-oxide fibers metal fibers, other inorganic fiber structures, or a combination of these. However, for ease of explanation, the use of ceramic fibers will be described, although it will be appreciated that other fibers may be used. Also, the substrate will often be described as a filtering substrate or a catalytic substrate, although other uses are contemplated and within the scope of this teaching. The designer selects the particular type of fiber based upon application specific needs. For example, the ceramic fiber may be selected as a mullite fiber, an aluminum silicate fiber, alumina fiber, silicon carbide fiber, or other commonly available ceramic fiber material. The fibers typically need to be processed 14 to cut the fibers to a usable length, which may include a chopping process prior to mixing the fibers with additives. Also, the various mixing and forming steps in the extrusion process will further cut the fibers.

According to specific requirements, additives 16 are added. These additives 16 may include binders, dispersants, pore formers, plasticizers, processing aids, catalysts, and strengthening materials. Also, fluid 18, which is typically water, is combined with the additives 16 and the fibers 12. The fibers, additives, and fluid are mixed to an extrudable rheology 21. This mixing may include dry mixing, wet mixing, and shear mixing. The fibers, additives, and fluid are mixed until a homogeneous mass is produced, which evenly distributes and arranges fibers within the mass. The fibrous and homogenous mass is then extruded to form a green substrate 23. The green substrate has sufficient strength to hold together during handling.

The green substrate is then cured 25. As used in this description, "curing" is defined to include two important process steps: 1) binder removal and 2) bond formation sufficient for handling strength. The binder removal process removes free water, removes most of the additives, and enables fiber to fiber contact. Often the binder is removed using a heating process that burns off the binder, but it will be understood that other removal processes may be used dependent on the specific binder used. For example, some binder may be removed using an evaporation or sublimation process. As the curing process continues, fiber to fiber bonds are formed. The curing process may also result in substantial sintering and strong bond formation in the interconnected fibrous network. Since later process steps will add strength using a CVD process, the fiber to fiber bonds formed in step 25 may only need to be sufficient for the substrate to maintain its pore arrangement during handling. Accordingly, the fiber to fiber bonds may be fully developed using solid state sintering, fully developed using a glass or glass-ceramic bond, or may be more loosely coupled. The substrate is now moved for CVD strengthening.

In step 30, the substrate is moved to a CVD deposition area, such as a CVD deposition hood. Typically, the hood is vacuum sealed. Using a CVD process, a strengthening agent is disposed on the fibers, nodes, and fiber to fiber bonds, if any. The CVD layer is deposited as a thin and generally uniform layer of between about 0.5 micron and about 5 micron. Using such a thin layer, the resulting reduction in porosity is relatively insignificant. It will be appreciated that the material to CVD deposit may be selected from a wide range of strengthening agents. The particular strengthening agent may be selected based upon chemistry and thermal requirements of the final substrate, strength requirements, or cost constraints. Also, the coefficient of thermal expansion for the material is preferably selected to be relatively close to the coefficient of thermal expansion of the underlying fiber structure. Also, the particular material selected for strengthening agent may be selected according to the underlying fiber chemistry. For example, some strengthening processes may require that the strengthening layer chemically react with the fiber to provide full strength reactions.

Chemical vapor deposition (CVD) is a generic name for a group of processes that involve depositing a solid element, composition, or mixture material from a gaseous phase on to a substrate material. CVD covers such known processes as atmospheric pressure chemical vapor deposition, low-pressure chemical vapor deposition, metal organic chemical vapor deposition, plasma assisted chemical vapor deposition, laser chemical vapor deposition, photo chemical vapor deposition, chemical vapor infiltration, and chemical beam epitaxy. It will be understood that one skilled in the art may select an appropriate CVD process to meet particular application and cost requirements. It will also be understood that certain of the processes are more adaptable to scale manufacturing than others. It will also be understood that certain processes may be usefully for proving deposition and strengthening performance, while others may be used for full-scale manufacturing. A typical CVD process is applied only a few microns thick, and a typical CVD process may deposit at the rate of a few hundred microns per hour. In this way, a single CVD hood or deposition station may coat several substrates each hour. Materials and the strengthening layer are generally deposited from a gaseous state during CVD. CVD is known to be a very versatile process for providing coatings on parts, tools, and machinery. By providing a fibrous substrate with pathways to fibers and fiber nodes, the CVD process may now be extended to effectively coat an open pore network to provide additional strength to a fibrous substrate. A key component of the CVD process is that a gas or vapor is used to deliver the material to the point of deposition, and so CVD does not require line of sight travel for the material. That is, the gas and its vaporized material may flow through the open pore network and deliver the strengthening material to coat fibers, fiber nodes, and bonds within the substrate block. In this way, strengthening agents may be distributed throughout the substrate structure.

Once the strengthening layer has been deposited on the fibers, nodes, or bonds, the layer may react to form a strengthening layer as shown in block 31. Alternatively, the interaction between the underlying fiber material and the CVD coating may be physical bonding, chemical bonding, van der Wall's interactions, physical adsorption, reactive adsorption or chemisorption. This strengthening layer may be relatively thin, but is able, if correct strengthening material is selected, to form a robust rigid structure. The rigid structure may be aided by ceramic bonds within the underlying fibrous architecture. In some cases, additional processes may be operated to further strengthen the strengthening layer. For example, the strengthening layer may need heat to properly strengthen, may need to react in the presence of particular atmospheres, or may need heat and time to react with fiber material. It will also be understood that the CVD process may require multiple layer deposition. In this way, layers may react with each other to further provide strength.

The substrate may then be used as a substrate for many applications, including as a substrate for filtering applications and catalytic conversion applications. In some cases, the CVD process may also be used to deposit catalytic material. Advantageously, system 10 has enabled a desirable extrusion process to produce stronger substrates having porosities of up to about 90%.

Generally, a fiber is considered to be a material with a relatively small diameter having an aspect ratio greater than one. The aspect ratio is the ratio of the length of the fiber divided by the diameter of the fiber. As used herein, the 'diameter' of the fiber assumes for simplicity that the sectional shape of the fiber is a circle; this simplifying assumption is applied to fibers regardless of their true sectional shape. For example, a fiber with an aspect ratio of 10 has a length that is 10 times the diameter of the fiber. The diameter of the fiber may be 6 micron, although diameters in the range of about 1 micron to about 25 microns are readily available. It will be understood that fibers of many different diameters and aspect ratios may be successfully used in system 10. As will be described in more detail with reference to later figures, several alternatives exist for selecting aspect ratios for the fibers. It will also be appreciated that the shape of fibers is in sharp contrast to the typical ceramic powder, where the aspect ratio of each ceramic particle is approximately 1.

Figure 2:
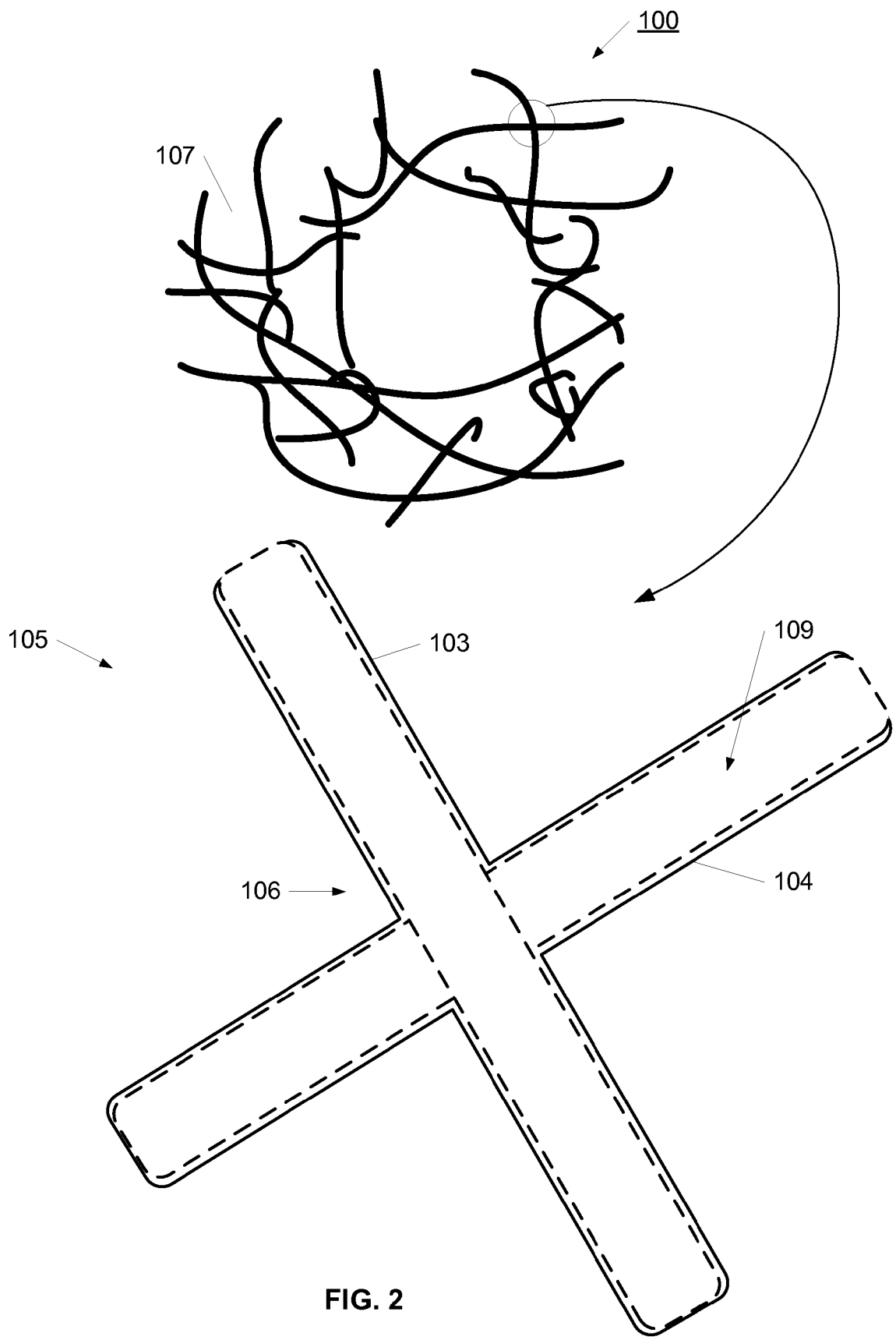
FIG. 2 is an enlarged (not to scale) illustration of a fibrous structure strengthened by a CVD process in accordance with the present invention.

Referring to FIG. 2, an enlarged strengthened area 105 of a porous substrate portion 100 is illustrated. The substrate portion 100 is illustrated after at least most binder has been removed, but before substantial glass bonds or sintered bonds have been formed. In this way, the fibers are tangled together in an arrangement that gives sufficient strength during the CVD application process. The binder and pore formers were burned off in a controlled manner so as not to significantly disrupt the arrangement of the fibers or have the substrate collapse. Typically, the binder and pore formers are selected to degrade or burn off prior to forming bonds between the fibers. As the curing process continues, the overlapping and touching fibers may begin to form bonds, depending on the nature of bond-formation. For example, the bonds may constitute solid-state sintering, liquid-assisted sintering, glass-bonding, ceramic bonding, gellation, crystalline bonding, glass-ceramic bonding, grain-growth, etc. It will be appreciated that the bonds may be formed in several ways and to various degrees of completion. The process of bond-formation may also be stopped prematurely in certain cases.

In cases where an intermediate layer, or a coating on the fibers is desirable, the fibers may be coated with organic material, such s starch solution, methyl-cellulose solution and other soluble organic solutions such that a thin layer of the organic material forms on top of the fibers. In some cases, the organic material may be heated in an Argon or Nitrogen atmosphere (lack of oxygen), to char the organics and convert the organic coating into a thin coating of charred carbon.

The porous substrate was positioned for CVD deposition, and a thin layer 109 of strengthening agent was deposited around fibers 103 and 104, for example. The layer 109 may be, for example, 0.5 to 3 microns thick, and may be deposited in way that does not substantially interfere with the open pore network 107 generally formed by the fibers. The presence of the coating reduces the overall porosity, but not by a large amount, and the open-pore network is not disrupted by the formation of closed or clogged pores. The layer 109 may be selected and deposited to from a strengthening layer over the fibers during the CVD deposition process, or the layer may be processed additionally to densify, rigidify and further increase strength. For example, some layers 109 may be built up using sequential depositions of reactive materials. As layers are added, the layers interact with each other, the fiber, or the atmosphere to form a strong coating around the fibers 104 and 103, as well as around the node 106 at fiber intersections. Other layer materials may need to be heated or chemically reacted with the fibers to fully strengthen.

The resulting strengthened substrate may be further processed to increase the strength of the strengthening layer. For example, the porous substrate may be subjected to particular heat or heat cycles or to particular atmospheric conditions. These conditions may cause reactions in the strengthening layer to more fully develop strength. In another example, the strengthening layer is selected to chemically react with the fiber material.

Figure 3:
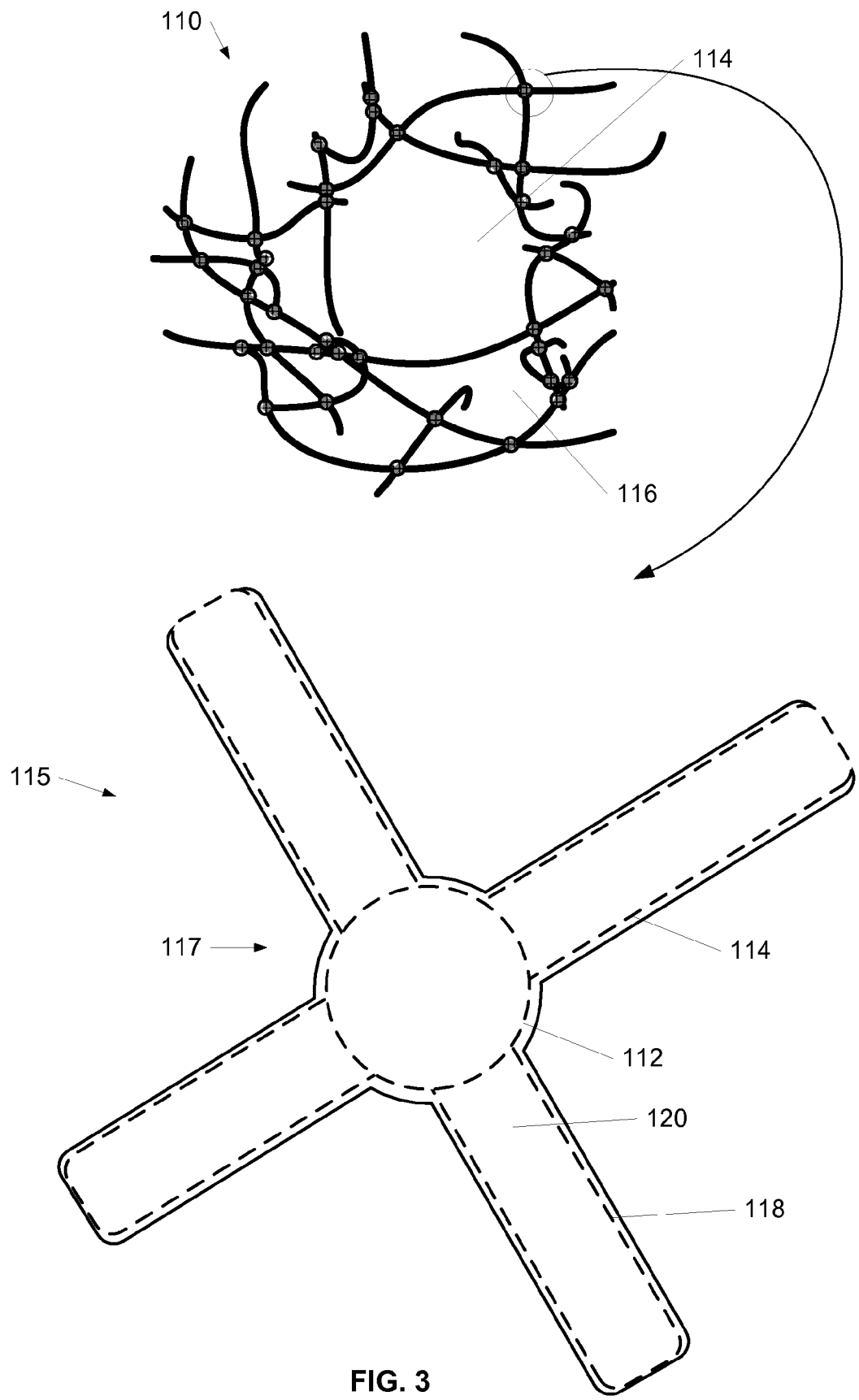
FIG. 3 is an enlarged (not to scale) illustration of a fibrous structure strengthened by a CVD process in accordance with the present invention.

Referring now to FIG. 3, another enlarged strengthened area 115 of a porous substrate portion 110 is illustrated. The substrate portion 110 is illustrated after full binder removal and after the curing process has formed fiber to fiber bonds at fiber intersections. The strengthening layers of FIG. 3 are similar to the strengthening layers and substrate described with reference to FIG. 2, so will not be described in detail. Substrate 110 has been more fully cured to develop sintered or glass bonds at fiber intersections. Accordingly, when the substrate is exposed to CVD layering, the CVD layer 120 evenly coats fibers 118 and 114, the node 117, as well as any fiber bonds 112 that exists. In this way, the strengthening layer acts to fully encase and strengthen the fiber, node, and bond structure. This arrangement may lead to significant strength increases, even for a fully bonded substrate structure. Although such a strengthening layer may not be necessary for many applications, additional strength may be required for certain applications and field of use. In other applications, the presence of the CVD coating may allow the substrate to exhibit properties previously not possible, such as conducting electromagnetic radiation (e.g. microwave, radiowaves, infra-red), heat or electricity. In some applications, it is also possible for the CVD coating put onto the substantially fibrous porous material acts as a high surface area washcoat (such as gamma-alumina), oxygen storage component (such as ceria), catalyst (such as Pt, Pd, Rh), opacifying agent, emissivity enhancer, heat conductor, electricity conductor or as a biologically or chemically active species.

Figure 3A:
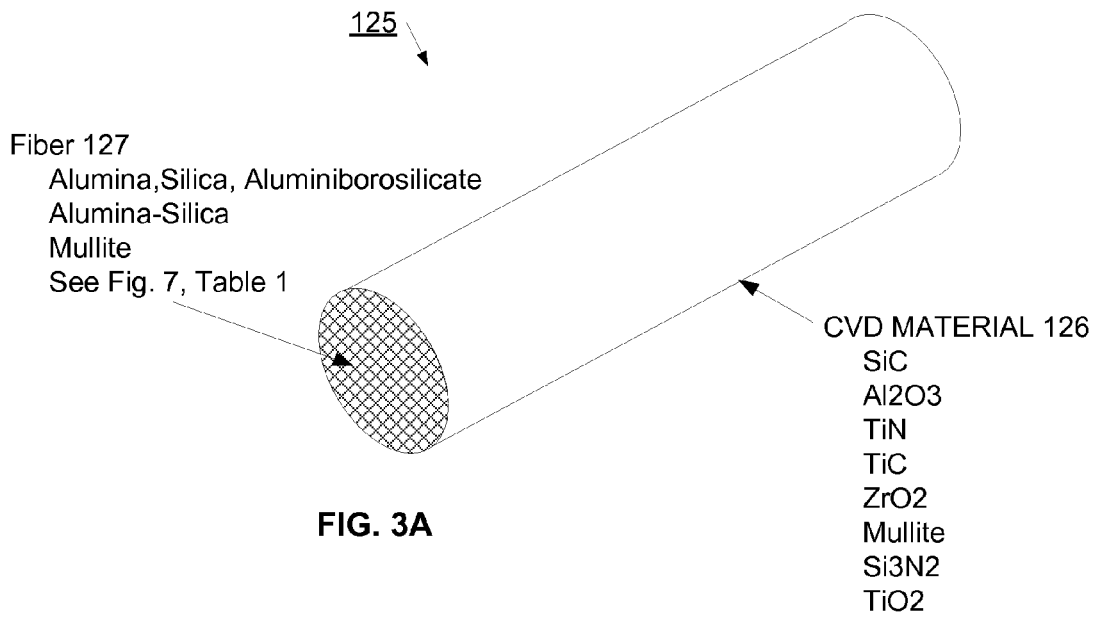

Referring now to FIG. 3A, a short section of a single strengthened fiber 125 is illustrated. In FIG. 3A, a fiber 127 has been coated with a thin layer of material 126 using a CVD process. It will be understood that the selection of fiber and coating materials may responsive to the specific chemical, thermal, and strength requirements for an application. FIG. 3A specifically identifies a few fibers 127 and a few CVD materials 126 that may be used in forming strengthened substrates appropriate for an exhaust gas filter and as a substrate for catalysts in an exhaust gas catalytic converter. It will be appreciated that many fibers and coating combinations may be useful.

Figure 4:
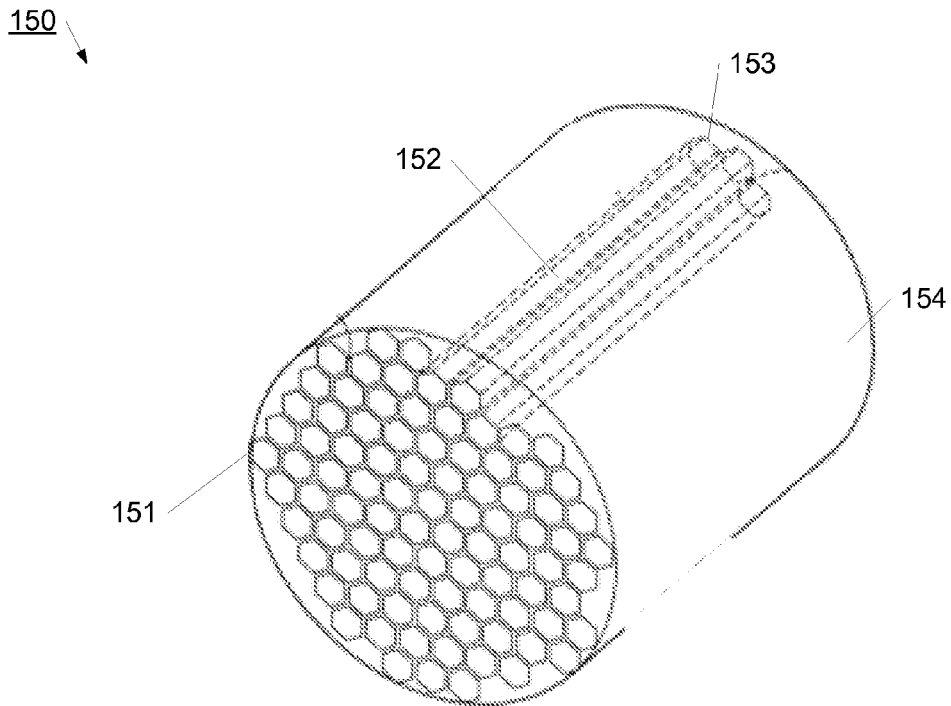
FIG. 4 is an illustration of a filter substrate strengthened by a CVD process in accordance with the present invention.

The strengthening process generally described thus far is used to produce a highly advantageous and porous substrate. In one example, the porous substrate may be extruded into a filter block substrate 150 as illustrated in FIG. 4. Substrate block 150 has been extruded using a piston or screw extruder. Advantageously, the extrudable mixture was a fibrous extrudable mixture having sufficient plasticizer and other additives to allow extrusion of fibrous material. The extruded green state block was cured to remove free water, organics, volatile components and for fibers to intersect and form bonding at the intersection nodes. With the open-pore fibrous architecture exposed to fluid flow, the CVD process is able to deposit a strengthening agent or layer around fibers and fiber nodes. The strengthening layer may be CVD deposited on the outside 154 of the block 150, on the channel walls at the inlet and outlet 153 openings, and may even be deposited in the interior regions 152 of the block. It will be appreciated that the CVD process may be adjusted to more fully coat interior surfaces of the block 150. It will also be appreciated that the CVD process may be adjusted to deposit different amounts of material at different positions on the block. For example, exterior wall 154 and wall near the inlet 151 and outlet 153 are likely to be subjected to the most mechanical stresses, so may benefit from additional strengthening material. In contrast, areas in the block 152, may not need as much strengthening material, and may benefit by having a more porous open pore network. The deposited layer adds additional strength to the fiber substrate structure, which may supplement the inherent strength of bonding at the nodes. It will be appreciated that the block 150 may be further processed after CVD deposition to further react or strengthen the strengthening layer. The resulting block 150 is thereby strengthened to perform in a wider range of applications, has a highly desirable porous characteristics, and maintains its excellent permeability and high usable surface area. Also, depending on the particular fibers and additives selected, the block 150 may be constructed for advantageous depth filtering.

When used as a flow-through device, the high porosity of block 150 enables a large surface area for the application of catalytic material. In this way, a strong and highly effective and efficient catalytic converter may be made, with the converter having a low thermal mass. With such a low thermal mass, the resulting catalytic converter has good light off characteristics, and efficiently uses catalytic material. When used in a wall flow or wall filtering example, the high permeability of the substrate walls enable relatively low back pressures, while facilitating depth filtration. This depth filtration enables efficient particulate removal, as well as facilitates more effective regeneration. In wall-flow design, the fluid flowing through the substrate is forced to move through the walls of the substrate, hence enabling a more direct contact with the fibers making up the wall. Those fibers present a high surface area for potential reactions to take place, such as if a catalyst is present. Since the extrudable mixture may be formed from a wide variety of fibers, additives, and fluids, the chemistry of the extrudable mixture may be adjusted to generate a block having specific characteristics. Also, the chemistry of the strengthening layer may be adjusted for application specific requirements. For example, if the final block is desired to be a diesel particulate filter, the fibers and coatings are selected to account for safe operation even at the extreme temperature of an uncontrolled regeneration. In another example, if the block is going to be used to filter a particular type of exhaust gas, the fiber and strengthening agent, and bonds are selected so as not to react with the exhaust gas across the expected operational temperature range. In other cases, the presence of such coatings can enable the substrate to be used in tandem or integrated into devices utilizing sensors, microwave heating devices, RF heating devices, electric heaters, electric sensors and fuel reformers. Although the advantages of the high porosity substrate have been described with reference to filters and catalytic converters, it will be appreciated that many other applications exist for the highly porous substrate.

Figure 7:
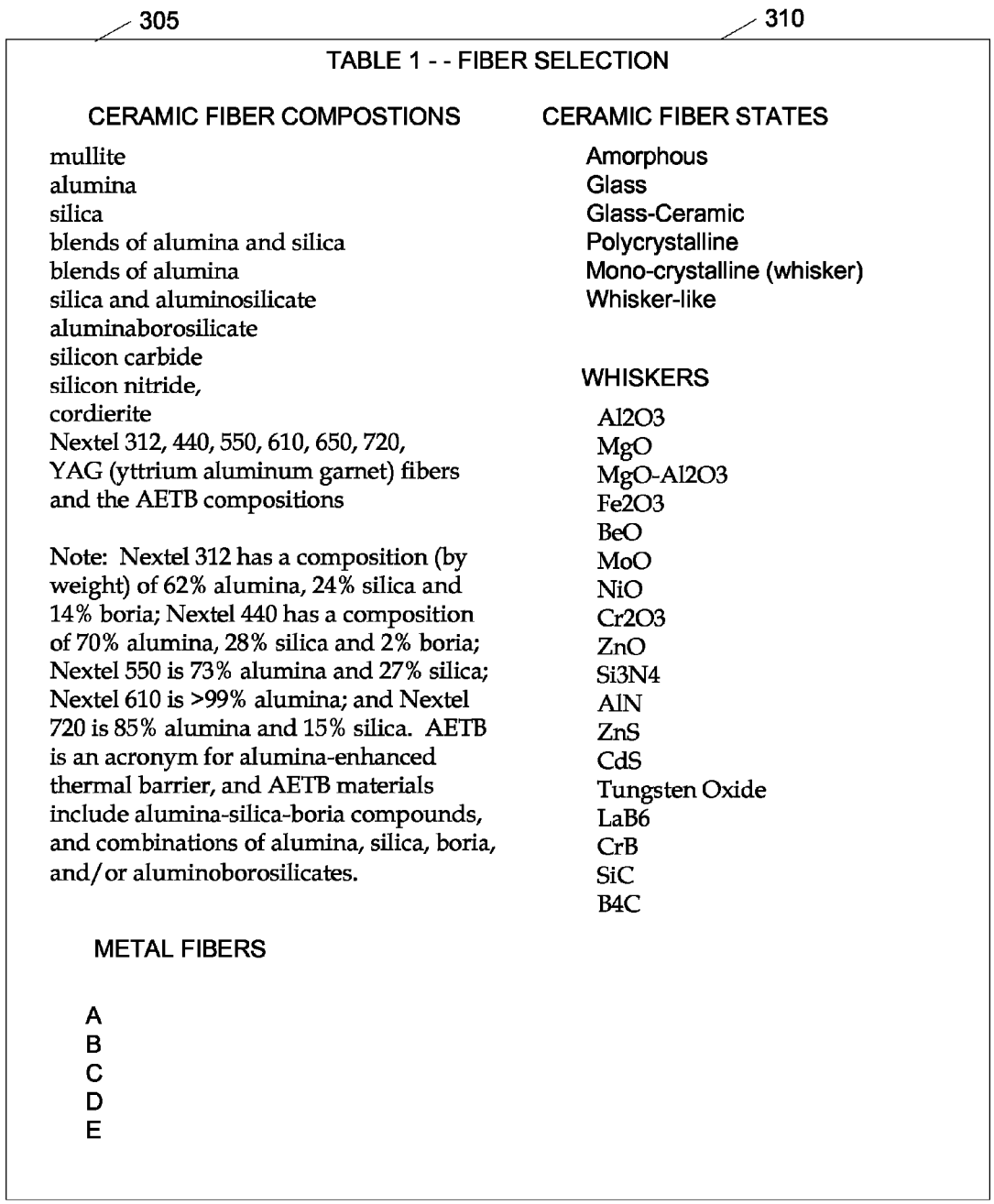
FIG. 7 are tables of fibers, binders, pore formers, fluids, and rheologies useful with the present invention.

The porous substrate may be formed from a wide variety of base materials, and strengthened with a wide range of CVD-applicable materials. The selection of the proper materials is generally based on the chemical, mechanical, and environmental conditions that the final substrate must operate in, and the required mechanical and stress constraints. Accordingly, a first step in designing a porous substrate is to understand the final application for the substrate. Based on these requirements, particular fibers, binders, pore formers, fluids, clays, ceramic precursors, whiskers, glass-ceramics, glasses, and other strengthening materials may be selected. It will also be appreciated that the process applied to the selected materials may affect the final substrate product. Since the fiber and strengthening layer are the primary structural material in the final substrate product, the selection of the fiber and strengthening material is critical for enabling the final substrate to operate in its intended application. Accordingly, the fibers and strengthening material are selected according to the required strength requirements, and a particular type of bonding process is selected. It will also be appreciated that some fibers may be consumed during the curing, bonding, or strengthening processes. FIG. 7, Table 1, shows several types of fibers that may be used to form a fibrous extrudable mixture. Generally, the fibers may be ceramic, glass or they may be metallic. For ceramic materials, the fibers may be in different states, such as amorphous, vitreous, poly-crystalline or mono-crystalline. Although Table 1 illustrates many available fibers, it will be appreciated that other types of fibers may be used.

Binders and pore formers may then be selected according to the type of fibers selected, as well as other desired characteristics. In one example, the binder is selected to facilitate a particular type of liquid state bonding between the selected fibers. More particularly, the binder has a component, which at a bonding temperature, reacts to facilitate the flow of a liquid bond to the nodes of intersecting fibers. Also, the binder is selected for its ability to plasticize the selected fiber, as well as to maintain its green state strength, even when partially burnt off. In one example, the binder is also selected according to the type of extrusion being used, and the required temperature for the extrusion. For example, some binders form a gelatinous mass when heated too much, and therefore may only be used in lower temperature extrusion processes. In another example, the binder may be selected according to its impact on shear mixing characteristics. In this way, the binder may facilitate chopping fibers to the desired aspect ratio during the mixing process. The binder may also be selected according to its degradation or burnoff characteristics. The binder needs to be able to hold the fibers generally into place, and not disrupt the forming fiber structure during burnoff. For example, if the binder burns off too rapidly or violently, the escaping gases may disrupt the forming structure. Also, the binder may be selected according to the amount of residue the binder leaves behind after burnout. Some applications may be highly sensitive to such residue.

Pore formers may not be needed for the formation of relatively moderate porosities. For example, the natural arrangement of the fibers within the binder may cooperate to enable a porosity of about 40% to about 60%. In this way, a moderate porosity substrate may be generated using an extrusion process without the use of pore formers. In some cases, the elimination of pore formers enables a more economical porous substrate to be manufactured as compared to known processes. However, when a porosity of more than about 60% is required, pore formers may be used to cause additional airspace within the substrate. The pore formers also may be selected according to their degradation or burnoff characteristics, and also may be selected according to their size and shape. Pore size may be important, for example, for trapping particular types of particulate matter, or for enabling particularly high permeability. The shape of the pores may also be adjusted, for example, to assist in proper alignment of the fibers. For example, a relatively elongated pore shape may arrange fibers into a more aligned pattern, while a more irregular or spherical shape may arrange the fibers into a more random pattern.

The fiber may be provided from a manufacturer as a chopped fiber, and used directly in the process, or a fiber may be provided in a bulk format, which is typically processed prior to use. Either way, process considerations should take into account how the fiber is to be processed into its final desirable aspect ratio distribution. Generally, the fiber is initially chopped prior to mixing with other additives, and then is further chopped during the mixing, shearing, and extrusion steps. It will be appreciated that the chopping of fibers to the proper aspect ratio distribution may be done at various points in the overall process. Once the fiber has been selected and chopped to a usable length, it is mixed with the binder and pore former. This mixing may first be done in a dry form to initiate the mixing process, or may be done as a wet mix process. Fluid, which is typically water, is added to the mixture. In order to obtain the required level of homogeneous distribution, the mixture is shear mixed through one or more stages. The shear mixing or dispersive mixing provides a highly desirable homogeneous mixing process for evenly distributing the fibers in the mixture, as well as further cutting fibers to the desired aspect ratio.

FIG. 7 Table 2 shows several binders available for selection. It will be appreciated that a single binder may be used, or multiple binders may be used. The binders are generally divided into organic and inorganic classifications. Typically, the organic binders will burn off at a lower temperature during curing, while the inorganic binders will burn off at a higher temperature, or form a part of the final substrate. Some inorganic binders have a refractory nature and do not burn off during the curing process, but aid in forming bonds between the fibers to hold the three-dimensional open pore network. Although several binder selections are listed in Table 2, it will be appreciated that several other binders may be used. FIG. 7 Table 3 shows a list of pore formers available. Pore formers may be generally defined as organic or inorganic, with the organic typically burning off at a lower temperature than the inorganic. Although several pore formers are listed in Table 3, it will be appreciated that other pore formers may be used. FIG. 7 Table 4 shows different fluids that may be used. Although it will be appreciated that water may be the most economical and often used fluid, some applications may require other fluids. Although Table 4 shows several fluids that may be used, it will be appreciated that other fluids may be selected according to specific application and process requirements.

In general, the mixture may be adjusted to have a rheology appropriate for advantageous extrusion. Typically, proper rheology results from the proper selection and mixing of fibers, binders, dispersants, plasticizers, pore formers, and fluids. Once the proper fiber, binder, and pore former have been selected, the amount of fluid is typically finally adjusted to meet the proper rheology. A proper rheology may be indicated, such as by one of two tests. The first test is a subjective, informal test where a bead of mixture is removed and formed between the fingers of a skilled extrusion operator. The operator is able to identify when the mixture properly slides between the fingers, indicating that the mixture is in a proper condition for extrusion. A second more objective test relies on measuring physical characteristics of the mixture. Generally, the mixture is formed into a cylinder, and a vertical and a shear force is applied. Measurements are taken and plotted according to a comparison of cohesion strength according to pressure. By measuring the mixture at various mixtures and levels of fluid, a rheology chart identifying rheology points may be created. Additionally, several direct and indirect tests for measuring rheology and plasticity do exist, and it is appreciated that any number of them can be employed to check if the mixture has the right rheology for it to be extruded into the final shape of the product desired.

Once the proper rheology has been reached, the mixture is extruded through an extruder. The extruder may be a piston extruder, a screw extruder, or a double screw extruder. The extruding process may be highly automated, or may require human intervention. The mixture is extruded through a die having the desired cross sectional shape for the substrate block. The die has been selected to sufficiently form the green substrate. In this way, a stable green substrate is created that may be handled through the curing process, while maintaining its shape and fiber alignment.

The green substrate is then cured. Curing generally requires the removal of free water to dry the green substrate. It is important to dry the green substrate in a controlled manner so as not to introduce cracks or other structural defects. The temperature may then be raised to burn off additives, such as binders and pore formers. The temperature is controlled to assure the additives are burnt off in a controlled manner. It will be appreciated that additive burn off may require cycling of temperatures through various timed cycles and various levels of heat. The additives may be fully burnt off, or some binder may remain to assist in holding the fiber structure together during the CVD process. Alternatively, the additives may be more fully burned off, and the substrate heated to the required temperature to form structural bonds at fiber intersection points or nodes. The required temperature is selected according to the type of bond required and the chemistry of the fibers. For example, liquid state bonds are typically formed at a temperature lower than solid state bonds. It will also be appreciated that the amount of time at the bonding temperature may be adjusted according to the specific type of bond being produced. After the fiber bonds have been formed, the substrate is slowly cooled down to room temperature. It will be appreciated that the curing process may be accomplished in one oven or multiple ovens, and may be automated in a production oven.

The substrate now has pathways exposing fibers and fiber nodes, but in some cases, may be relatively weak. Accordingly, the substrate is positioned for CVD processing, and a strengthening agent disposed over accessible fibers, fiber nodes, and bonds, if present. The strengthening agent is used to add strength or rigidity to fibers, nodes, and bonds, and may benefit from further processing.

Figure 5:
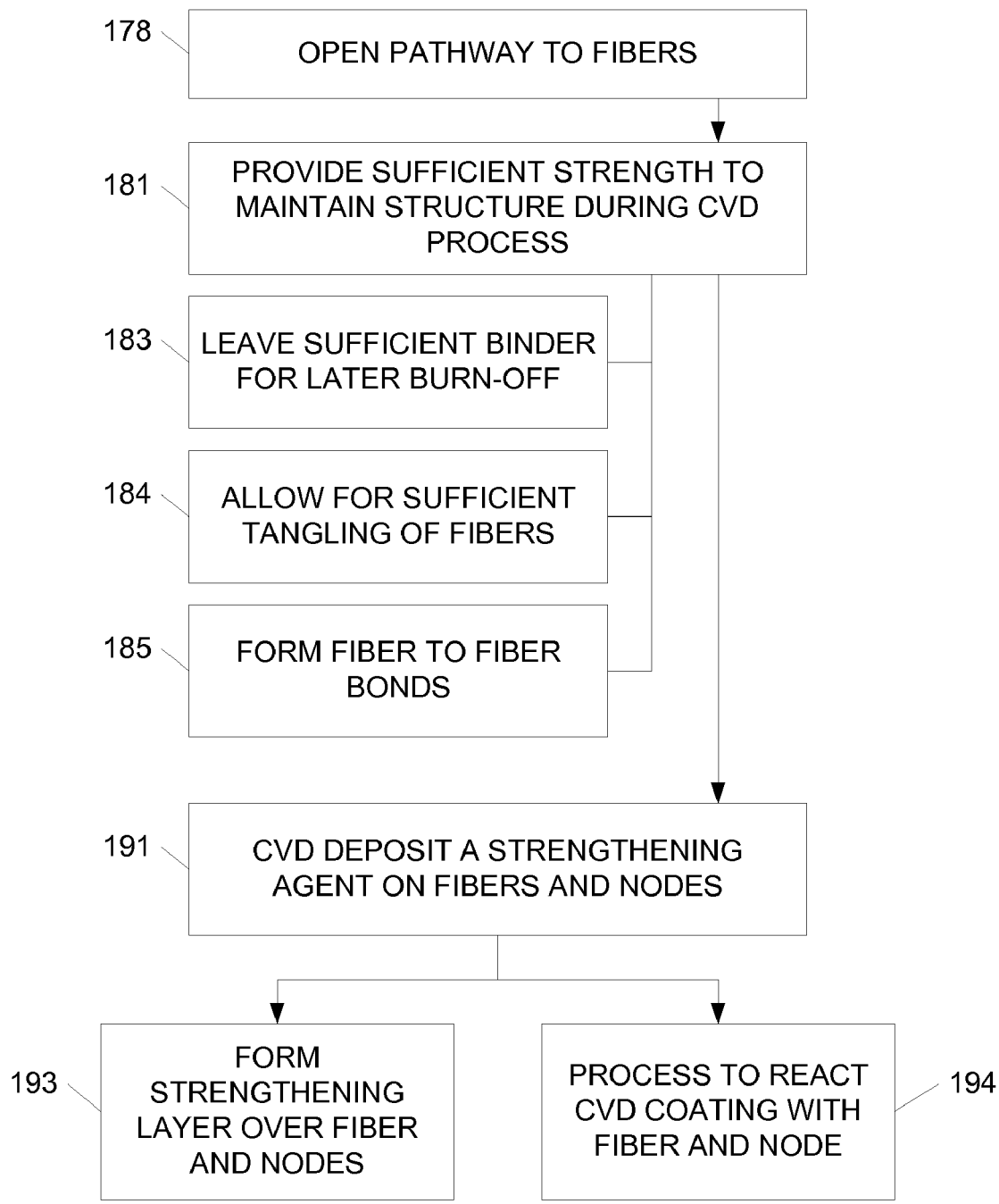
FIG. 5 is a flowchart of a CVD process for strengthening a porous substrate in accordance with the present invention.

Referring now to FIG. 5, a process for strengthening a porous substrate is illustrated. Process 175 has a substrate on which pathways have been opened to fibers and fiber nodes as shown in block 178. This may be done, for example, by binder burn off from a green substrate, and may include forming fiber to fiber bonds in the substrate. Despite the open pathways in the substrate, the substrate must have sufficient strength to maintain its structure during handling for the CVD process as shown in block 181. It will be appreciated several alternatives exist to maintaining such handling strength. For example, sufficient binder may remain in the structure to hold the fibers into position as shown in block 183. Then, as the CVD process continues and the substrate is subjected to further heating, the binder more fully burns off, and in some cases, the binder may have been selected to assist the CVD layer in strengthening. In another example, the binder may be more fully burned off, but the fiber arrangement and fiber packing has been selected such that a sufficient tangling of fibers exists so that the fiber structure is maintained during handling, as shown in block 184. In a final example, the substrate may be subjected to sufficient heat to begin forming fiber to fiber bonds as shown in block 185. These fiber to fiber bonds may be in the form of glass, glass ceramic, or ceramic bonds. In another example, the bonds may be a sintered solid-state bond. It will be appreciated that other glass or crystalline bonding may be used. It will also be appreciated that the bonding may be partial or complete, depending upon application needs.

The substrate may then be moved to a position for CVD deposition as shown in block 191. The CVD process deposits a thin layer of strengthening material on the fibers, fiber nodes, and bonds if present. It will be appreciated that the layer may be in the range of about 0.5 micron to about 3 micron, although other thicknesses may be used depending upon material and application needs. It will also be appreciated that multiple layers of strengthening material may be used, and that layers may interact with each other to further strengthen the coating. The coating may form a strengthening layer over the fiber and nodes as shown in block 193, or may need additional processing to gain strength as shown in block 194. For example, the layer may need to chemically, thermally, or otherwise react with the atmosphere or fiber material to fully gain strength. The CVD coating may be put onto the individual fibers and the nodes in a batch process or a continual process.

Figure 6:
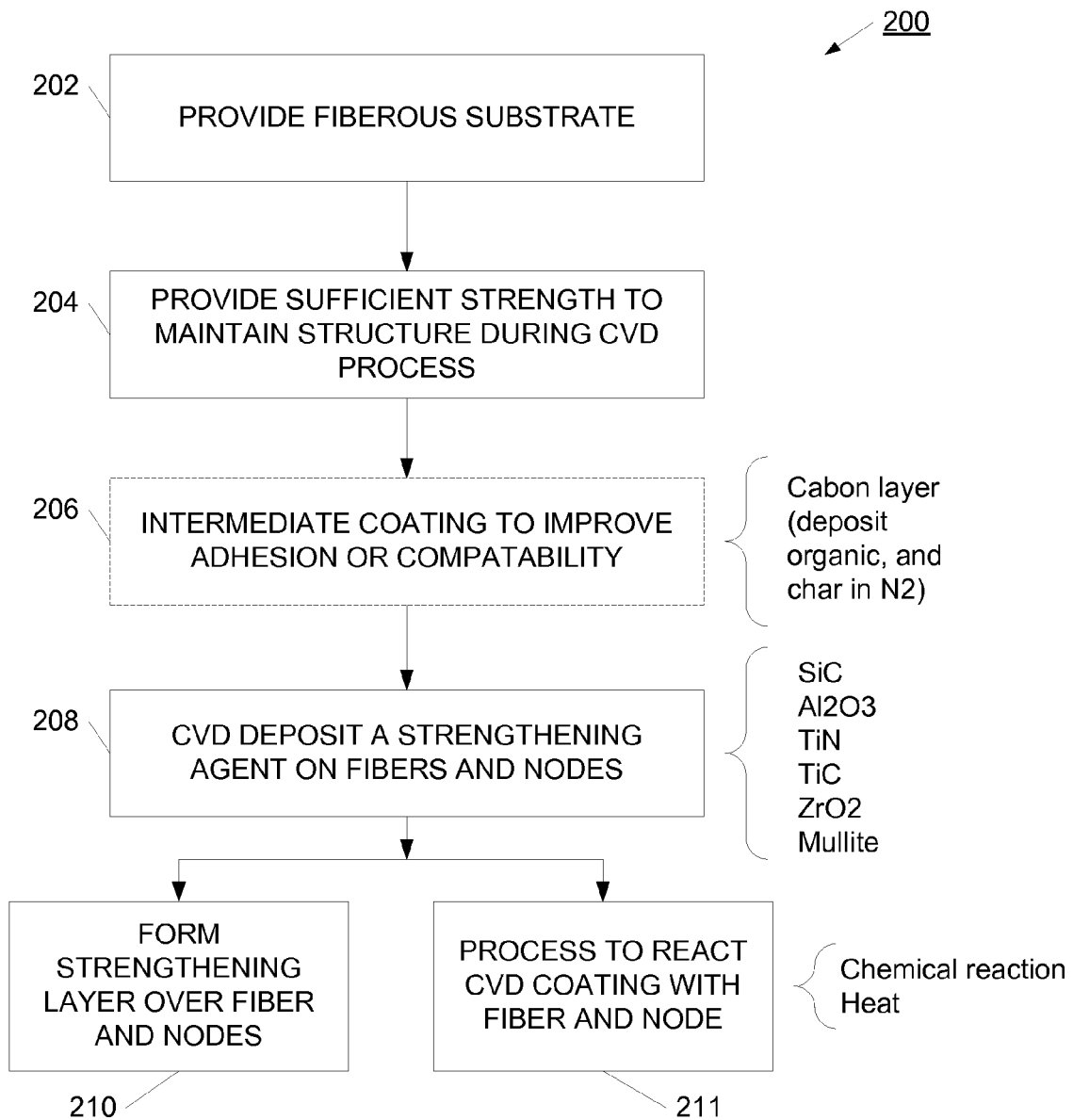
FIG. 6 is a flowchart of a CVD process for strengthening a porous substrate in accordance with the present invention.

Referring now to FIG. 6, a strengthening process for a porous substrate is illustrated. Process 200 provides a fibrous substrate as shown in block 202. Sufficient strength is maintained in the fibrous substrate to support a CVD process as shown in block 204. Sufficient strength is maintained even though open pathways are exposed to allow CVD gases to flow to individual fibers and nodes within the substrate structure. An intermediate coating may optionally be applied to the fibers to improve adhesion or compatibility as shown in block 206. For example, some fibers and coating materials may benefit from a thin carbon layer on the fiber. In one example, organic materials such as a starch are deposited on each fiber, and the organic material burned off in an $N_2$ environment. The resulting carbon layer allows certain types of strengthening agents to more readily adhere to fibers. In the case of a thermal expansion mismatch, the intermediate layer prevents the 'flaking' or separation of the coating from the fiber.

In block 208, the CVD process is used to layer a strengthening coat on to the fibers, nodes, and bonds if present. For example, the strengthening agents may include silicon carbide, silicon nitride, alumina, Titania, Titanium carbide, titanium nitride, zirconia, or mullite. It will be appreciated that other strengthening compounds or layers may be used. Once the layer or layers have been placed on the fibers and nodes, the materials react to form a strong coating around the fibers, nodes, and bonds if present as shown in block 210. In other examples, the layer must react with fiber, gaseous atmosphere, or other chemicals or heat to fully 'heal' or strengthen.

Figure 8:
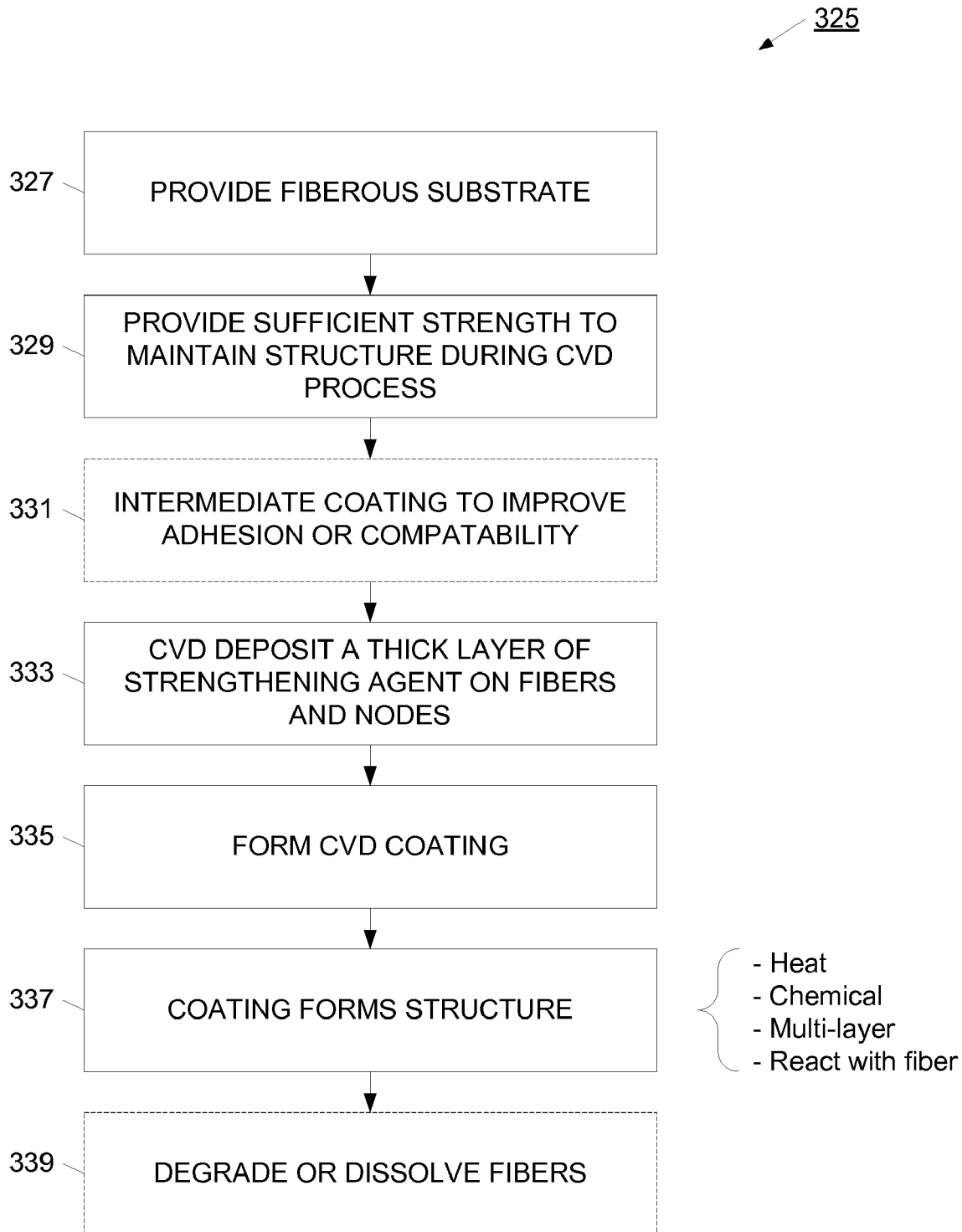
FIG. 8 is a flowchart of a CVD process for strengthening a porous substrate in accordance with the present invention.

Referring now to FIG. 8, a process for forming a substrate structure is illustrated. Process 325 provides a fibrous substrate as illustrated in block 327. The fiber substrate has pathways developed to enable CVD gases to readily surround fibers and fiber nodes, while maintaining sufficient strength to maintain the structure during the CVD process, as shown in block 329. As previously discussed, an intermediate coating may be applied to improve adhesion or compatibility as shown in block 331. A CVD process deposits a relatively thick layer of strengthening agent on the fibers and nodes as shown in block 333. By depositing one or more layers of strengthening material, a CVD coating is uniformly built on fibers and fiber nodes as shown in block 335. The coating is then used to form a structure for the fibrous substrate as shown in block 337. This structure may be formed through reactions between sub layers, through chemical reactions with the layer and the fiber and atmosphere, or through other thermal or chemical reactions. Importantly, it is the resulting coating that forms the mechanical structure for the fiber substrate. In this way, the initial fibrous material provides little, if any, support for the final substrate. In some cases, the fibers may even degrade or dissolve as shown in block 339 upon further processing. Even though the fibers degrade or dissolve, since the strength of the structure is from the rigidity of the CVD coating layer, the open-pore network and the fibrous architecture maintains its structural integrity.

While particular preferred and alternative embodiments of the present invention have been disclosed, it will be apparent to one of ordinary skill in the art that many various modifications and extensions of the above described technology may be implemented using the teaching of this invention described herein. All such modifications and extensions are intended to be included within the true spirit and scope of the invention as discussed in the appended claims.

What is claimed is:

1. A process for manufacturing a porous substrate comprising:
   mixing fibers with a binder and a liquid into a homogeneous mass;
   extruding the homogeneous mass into a honeycomb form to provide a green substrate;
   curing the green substrate by removing the binder and the liquid to provide providing a porous substrate consisting essentially of intersecting fibers;
   positioning the substrate in a CVD deposition station;
   depositing, using a CVD deposition process, a layer of strengthening agent on the fibers and fiber intersections; and
   forming a strengthening coating around the fibers and fiber intersections, the porous substrate maintaining the intersecting fiber structure.

2. The process according to claim 1, wherein the mixing step includes a pore former and the curing step includes removing the pore former.

3. The process according to claim 1, wherein the curing step includes burning off substantially all binder material from the substrate.

4. The process according to claim 1, wherein the curing step includes burning off less than all binder material from the substrate.

5. The process according to claim 1, further including the step of maintaining handling strength for positioning the substrate in the CVD deposition station.

6. The process according to claim 5, wherein the maintaining step includes forming the fibers into a tangled mass that substantially maintains its open pore network during positioning.

7. The process according to claim 5, wherein the maintaining step includes wherein the curing step includes burning off sufficient binder material to expose an open pore network, but retaining sufficient binder to hold the fibers during the positioning step.

8. The process according to claim 5, wherein the maintaining step includes forming glass, crystal or sintered bonds at some of the fiber intersections in the substrate.

9. The process according to claim 5, wherein the maintaining step includes forming glass, crystal or sintered bonds at substantially all of the fiber intersections in the substrate.

10. The process according to claim 1, wherein the strengthening agent is selected from the group consisting of silicon carbide, silicon nitride, alumina, Titania, Titanium carbide, titanium nitride, zirconia, or mullite.

11. The process according to claim 1, wherein the fiber is selected from the group consisting of mullite, alumina-silica, alumina, silica, aluminoborosilicate.

12. The process according to claim 1, wherein the fiber have a composition selected from the group consisting of mullite, alumina, silica, aluminosilicate, aluminoborosilicate, silicon carbide, silicon nitride, cordierite, and yttrium aluminum garnet.

13. The process according to claim 1, wherein a plurality of strengthening agents are applied in layers.

14. The process according to claim 1, wherein the forming step includes exposing the strengthening agent to heat or to a selected atmospheric chemistry.

15. The process according to claim 1, wherein the strengthening agent is SiC and the fiber is alumina-silica.

16. The process according to claim 1, wherein the strengthening agent is mullite and the fiber is mullite.

17. The process according to claim 1, wherein the strengthening agent is SiC and the fibers comprise alumina, silica, and aluminoborosilicate.

18. The process according to claim 1, wherein the strengthening agent is SiC and the fibers comprise alumina, and SiC.

19. The process according to claim 1, wherein the strengthening agent is SiC and the fiber is mullite.

* * * * *